(12) United States Patent
Adams

(10) Patent No.: US 12,501,740 B2
(45) Date of Patent: Dec. 16, 2025

(54) PHOTODIODES AND LIGHT EMITTING DIODES

(71) Applicant: The ADT Security Corporation, Boca Raton, FL (US)

(72) Inventor: Benjamin Amos Adams, Bristol, VA (US)

(73) Assignee: The ADT Security Corporation, Boca Raton, FL (US)

( * ) Notice: Subject to any disclaimer, the term of this patent is extended or adjusted under 35 U.S.C. 154(b) by 232 days.

(21) Appl. No.: 18/497,727

(22) Filed: Oct. 30, 2023

(65) Prior Publication Data
US 2025/0143012 A1 May 1, 2025

(51) Int. Cl.
H10F 77/42 (2025.01)
H10F 10/14 (2025.01)
H10F 19/40 (2025.01)

(52) U.S. Cl.
CPC ........... *H10F 77/488* (2025.01); *H10F 19/40* (2025.01); *H10F 10/14* (2025.01)

(58) Field of Classification Search
CPC ........ H10F 77/42; H10F 77/488; H10F 19/40; H10F 10/14
See application file for complete search history.

(56) References Cited

U.S. PATENT DOCUMENTS

| 5,072,109 A | 12/1991 | Aguilera et al. |
| 7,217,882 B2 | 5/2007 | Walukiewicz et al. |
| 7,394,188 B2 | 7/2008 | Ouderkirk et al. |
| 8,472,496 B2 | 6/2013 | Ledentsov |
| 8,797,662 B2 | 8/2014 | Hu et al. |
| 9,419,185 B2 | 8/2016 | Herner |
| 2007/0291808 A1 | 12/2007 | Ledentsov et al. |
| 2010/0089436 A1* | 4/2010 | Watters ................. H10F 77/488 136/246 |
| 2020/0358392 A1* | 11/2020 | Kiefer, III ............... H02S 40/38 |
| 2021/0086481 A1 | 3/2021 | Boyd et al. |
| 2021/0343890 A1 | 11/2021 | Vaananen |
| 2022/0344526 A1* | 10/2022 | Njie ........................ F24S 23/70 |

FOREIGN PATENT DOCUMENTS

| WO | 9960303 | 11/1999 |
| WO | 2008145176 A1 | 12/2008 |

OTHER PUBLICATIONS

The Giant Blue Morpho Butterfly (Morpho didius)_www-uvm-edu-~dahammon-Structural_Colors-Structural_Colors-The_Blue_Morpho_ Butter; Consisting of 4 pages.

* cited by examiner

*Primary Examiner* — Mayla Gonzalez Ramos
(74) *Attorney, Agent, or Firm* — Weisberg I.P. Law, P.A.

(57) ABSTRACT

According to some embodiments, a device is provided. The device comprises at least one semiconductor structure, comprising: a base portion and an elongated portion extending from the base portion, the elongated portion comprising a non-conducting material, and a plurality of P-type-N-type (P-N) junction branches positioned at different sections of the elongated portion. Each P-N junction branch comprises a photoactive diode having a photoactive area, and a conductor. Each P-N junction branch has a width, where the widths of the plurality of P-N junction branches decrease with increasing distance from the base portion, and where the semiconductor structure is configured to absorb photons over a range of wavelengths to which each P-N junction branch is photoactive.

20 Claims, 9 Drawing Sheets

PHOTODIODES AND LIGHT EMITTING DIODES

TECHNICAL FIELD

The present technology is generally related to photodiodes and light emitting diodes.

BACKGROUND

A photodiode is a semiconductor device with a P-N junction that converts photons (or light) into electrical current. A light emitting diode (LED) is a semiconductor device with a P-N junction that converts electrical current into photons. Photodiodes and LEDs can be manufactured from a variety of materials including, but not limited to, Silicon, Germanium, and Indium Gallium Arsenide. Each material uses different properties for cost benefits, increased sensitivity, wavelength range, low noise levels, or even response speed. Typical applications of photodiodes include digital cameras and solar panels.

BRIEF DESCRIPTION OF THE DRAWINGS

A more complete understanding of the present disclosure, and the attendant advantages and features thereof, will be more readily understood by reference to the following detailed description when considered in conjunction with the accompanying drawings wherein.

DETAILED DESCRIPTION

As used herein, relational terms, such as "first" and "second," "top" and "bottom," and the like, may be used solely to distinguish one entity or element from another entity or element without necessarily requiring or implying any physical or logical relationship or order between such entities or elements. The terminology used herein is for the purpose of describing particular embodiments only and is not intended to be limiting of the concepts described herein. As used herein, the singular forms "a", "an" and "the" are intended to include the plural forms as well, unless the context clearly indicates otherwise. The terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

In embodiments described herein, the joining term, "in communication with" and the like, may be used to indicate electrical or data communication, which may be accomplished by physical contact, induction, electromagnetic radiation, radio signaling, infrared signaling or optical signaling, for example. Multiple components may interoperate and modifications and variations are possible to achieve the electrical and data communication.

In some embodiments described herein, the term "coupled," "connected," and the like, may be used herein to indicate a connection, although not necessarily directly, and may include wired, magnetic electrical and/or wireless connections.

Figure 1:
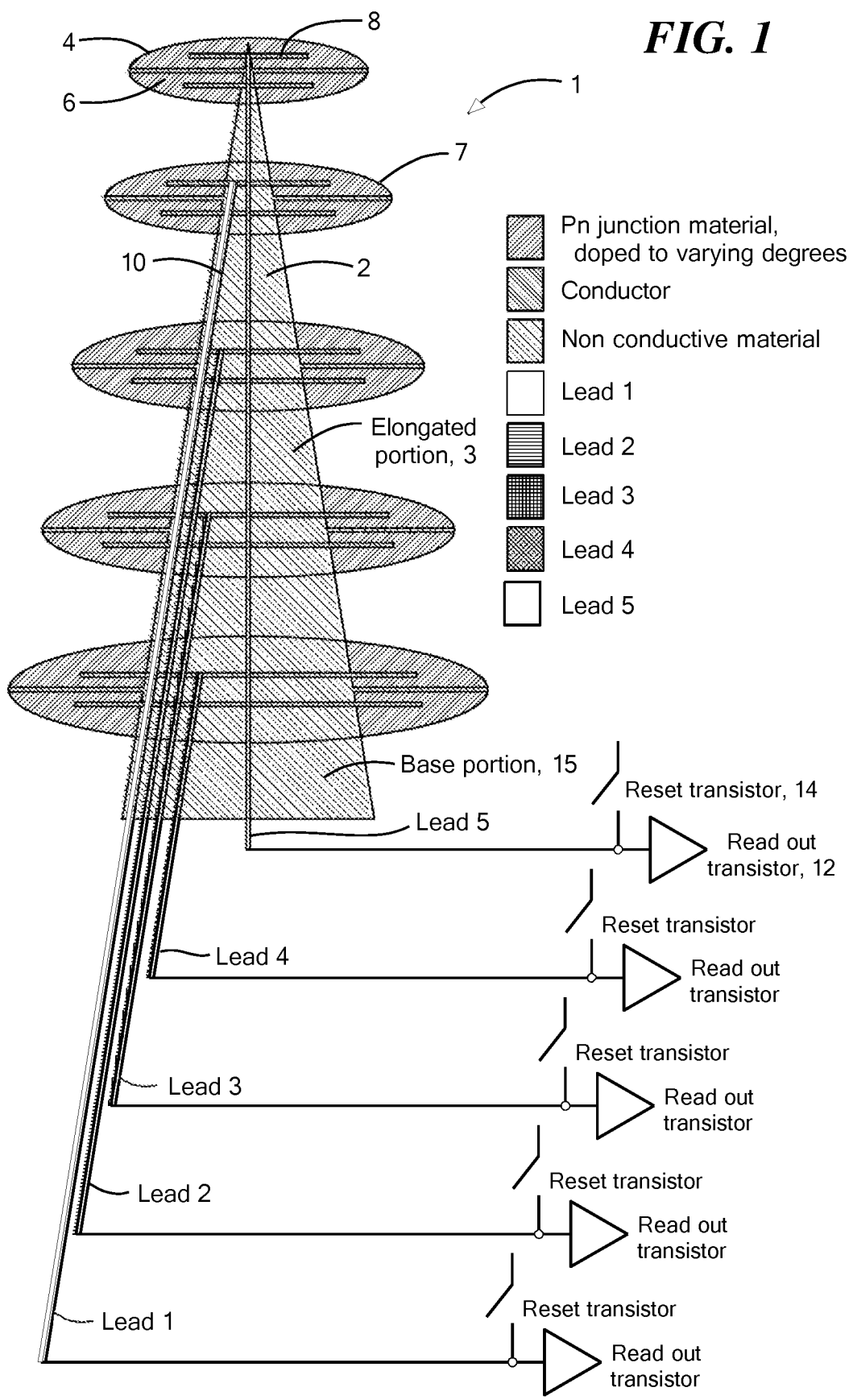
FIG. 1 is a device according to various embodiments of the present disclosure.

FIG. 1 is a diagram of an example of a device 1 according to some embodiments of the present disclosure. Device 1 comprises a semiconductor structure 2 having an elongated portion 3 on which are mounted a plurality of P-N junction branches 4 at different heights on the semiconductor structure 2. The elongated portion 3 of the semiconductor structure 2 may be configured to be or include a non-conductive material. Each P-N junction branch 4 may be configured to include a P-N junction material 6. Each P-N junction branch 4 has a distal end 7 that may be shaped to achieve greater absorption by the device 1 or photovoltaic conversion by the P-N junction material 6. The P-N junction material 6 may be connected to external circuitry by conductors 8. The P-N junction material 6 may include P-type and N-type material forming a photoactive diode as described herein.

A conductor 8 of each P-N junction branch 4 is electrically connected to a different lead 10. An opposite end of each lead 10 is electrically connected to an input of a different read out transistor 12. The input of each read out transistor 12 is electrically connected to a reset transistor 14. In some embodiments, a read out transistor 12 and/or a reset transistor 14 may be positioned and/or disposed at the base portion 15 of the semiconductor structure 2 or underneath the base portion 15 of the semiconductor structure 2. In some embodiments, each reset transistor 14 may be selectable by a shift register having parallel outputs. In some embodiments, some of the reset transistors 14 may be configured in an on-state while other reset transistors 14 are in an off-state. In some embodiments, the P-N junctions on the P-N junction branches 4 may be printed onto circuit boards by one or more known mechanisms such as by lithography. In some embodiments, the leads 10 may be etched onto the elongated portion 3 of the semiconductor structure 2, via lithography, for example. In some embodiments, the P-N branches 4 may be etched into or onto the elongated portion 3 of the semiconductor structure 2.

Note that in some embodiments, a single lead 10 may be electrically connected to the conductors 8 of more than one P-N junction branch 4. For example, for a solar cell configuration, only one lead 10 electrically connected to all of the P-N junction branches 4 may be configured, whereas for a camera configuration, there may be configured one lead 10 for each and every P-N junction branch 4. Note that although five P-N junction branches 4 are shown in FIG. 1, a fewer or greater number of P-N junction branches 4 may be configured on each semiconductor structure 2. Note also that although the leads 10 are shown as being electrically connected at certain points along the lengths of the conductors 8, the leads 10 may be electrically connected at other points along the lengths of the conductors 8.

Each P-N junction branch 4 has configured thereon, at least one photoactive diode formed by the P-N junction material 6. A photoactive diode may refer to a "photodiode" (which converts light waves to electricity) or a light emitting diode (LED) (which converts electricity to light waves).

In some embodiments, a photoactive depletion region of a photoactive diode of each P-N junction branch 4, may be placed on the bottom and/or top of each P-N junction branch 4. In some embodiments, the depletion region of a photoactive diode of one P-N branch 4 may be placed on the bottom of the P-N junction branch 4 and the depletion region of the photoactive diode of another P-N junction branch 4 may be placed on the top of the other P-N junction branch 4. In some embodiments, some photoactive diodes are placed on both the top and the bottom of a P-N junction branch.

Figure 2:
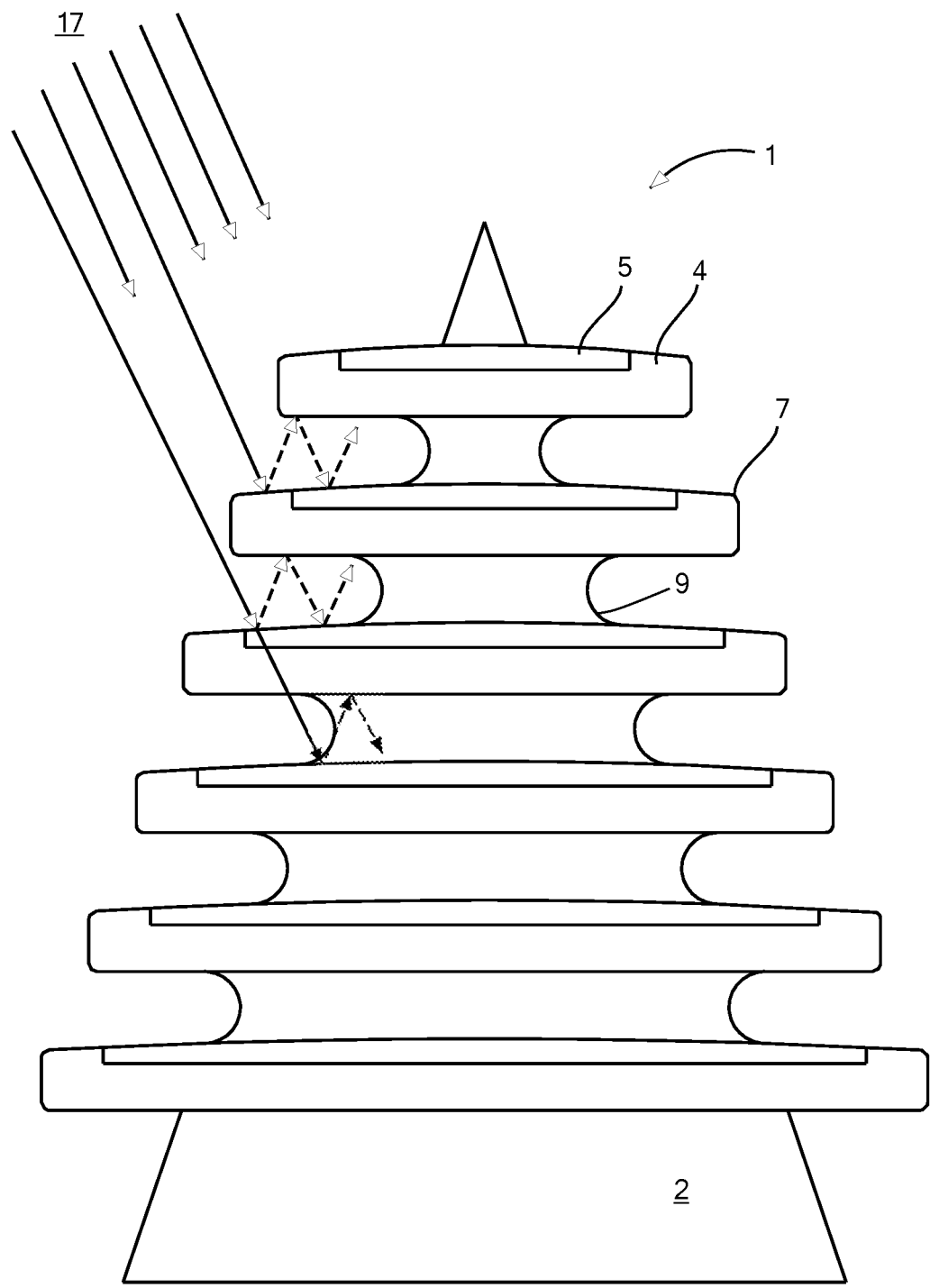
FIG. 2 is an example semiconductor structure of the device of FIG. 1 according to various embodiments of the present disclosure.

FIG. 2 is a diagram of an example of the semiconductor structure 2, having a plurality of levels of P-N junction branches 4 configured so that a depletion region 5 of a photoactive diode is on one side (e.g., upper side or side not facing base portion 15) of the P-N junction branches 4. In particular, light wave 17 is arriving at the semiconductor structure 2. One or both sides of one or more P-N junction branches 4 may exhibit curvature to increase light capture and photovoltaic conversion efficiency. Light wave 17 impinging on a P-N junction branch 4 is reflected repeatedly between P-N junction branches 4. As the light is reflected between P-N junction branches 4, the light decays in amplitude. The semiconductor structure 2 is of sufficient height such that very little or no light is reflected outward or outside of the semiconductor structure 2. Further, absorption of light waves 17 within the structure by the photoactive area of the P-N junction branches 4 increases. In some embodiments, the elongated portion 3 is configured to exhibit curvature 9 to increase capture of light between the P-N junctions branches 4. The distal end 7 of the P-N junction branches 4 may be rounded in some embodiments.

Figure 3:
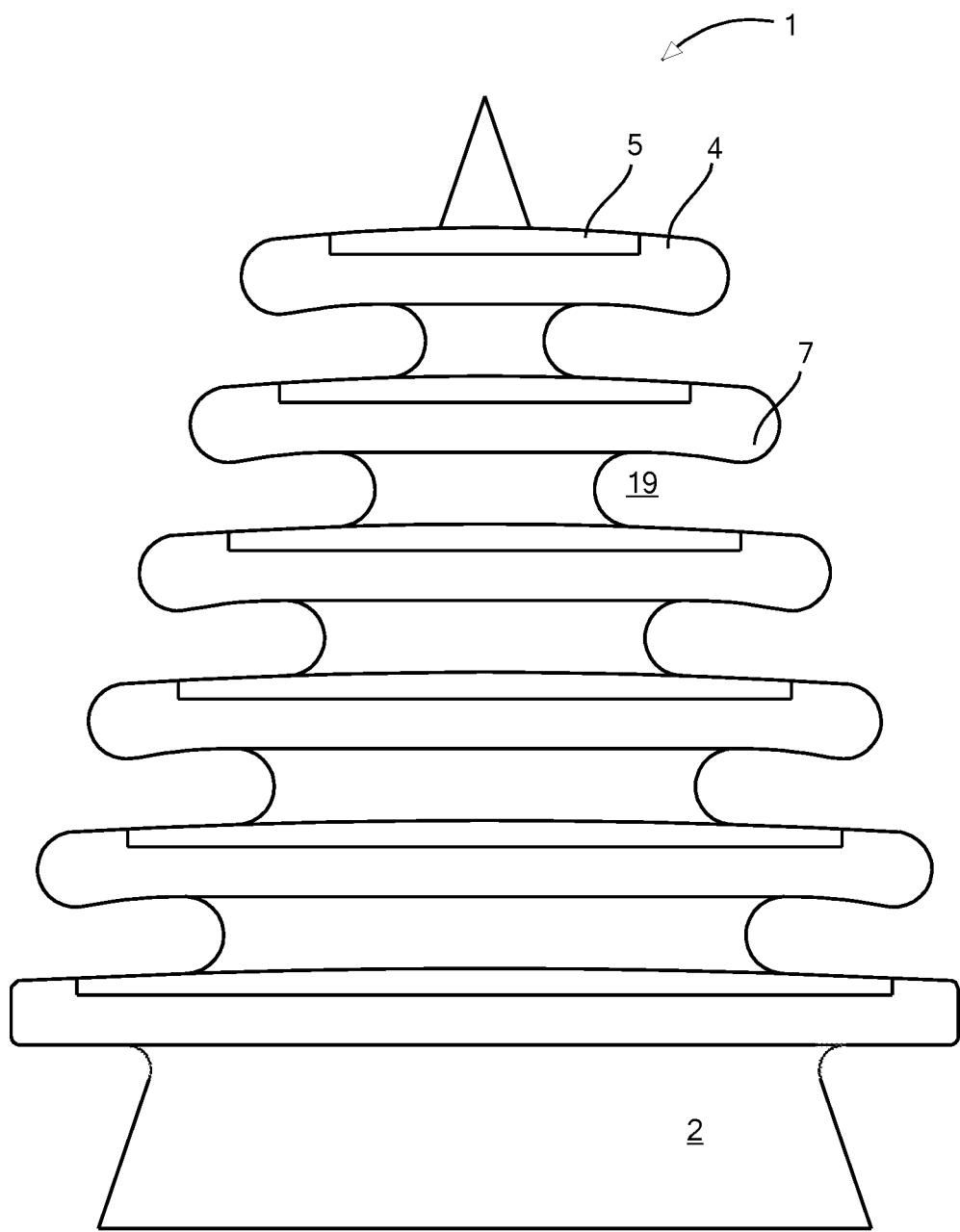
FIG. 3 is another example semiconductor structure of the device of FIG. 1 according to various embodiments of the present disclosure.

FIG. 3 is another example of the semiconductor structure 2 according to some embodiments of the present disclosure. As shown in FIG. 3, the distal ends 7 of the P-N junction branches 4 may be arranged in a teardrop or bulging type shape that, coupled with the curvature 9 of the elongated portion 3, forms a cavity 19 which may "trap" light waves within the cavity 19, where they bounce around and decay. The shape of distal ends 7, the curvature 9 of the elongated portion 3 and the curvature of the P-N junction branches may be configured to optimize the ability to trap light within the cavity 19. Moreover, different distal ends 7 of the same P-N junction branch 4 may be shaped differently, just as distal ends 7 of different P-N junction branches 4 may be shaped differently.

Figure 4:
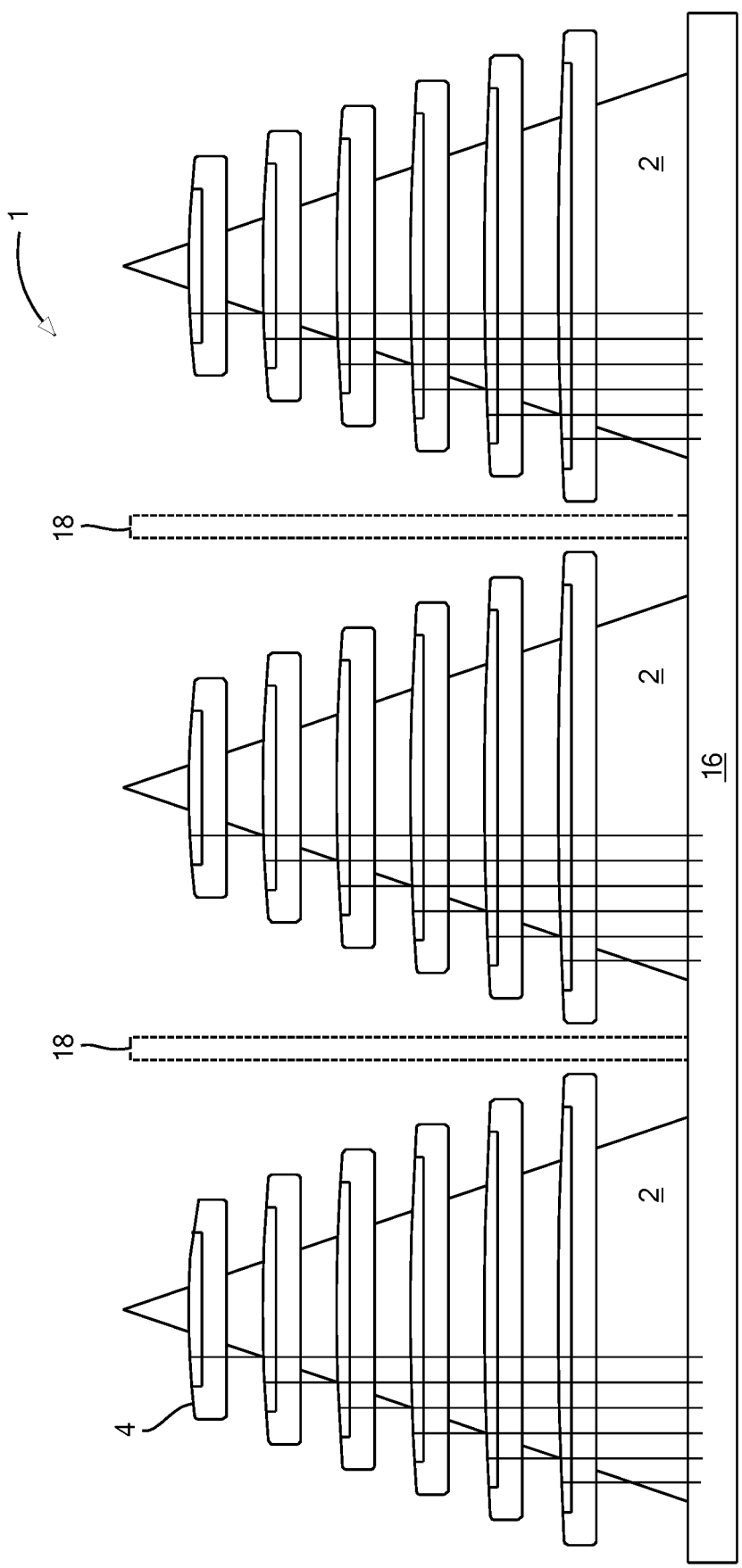
FIG. 4 is an array of semiconductor structures of the device of FIG. 1 according to various embodiments of the present disclosure.

FIG. 4 is a diagram of example rows of the semiconductor structure 2 according to some embodiments of the present disclosure. The spacing between rows of the semiconductor structures 2 may be less than 1 micrometer so that multiple rows of the semiconductor structures 2 may be included to form a photoactive area. The spacing between rows of the semiconductor structures 2 may be selected to increase wavelength selectivity. The rows of the semiconductor structure 2 may be separated by a reflecting wall 18, which may be configured to reflect light waves 17. In some embodiments, the reflecting wall 18 is wider at a support base 16 than at its apex. The read out transistors 12 and/or reset transistors 14 and/or associated circuitry may be configured on or in the support base 16. For example, the support base 16 may be a printed circuit board and the circuitry may be etched in one or more layers of the printed circuit board.

Each photoactive diode of each P-N junction branch 4 may be doped to optimize absorption for a particular wavelength. Also, a width and/or height of the P-N junction branch 4 may be selected to filter one or more specific wavelengths. In some embodiments, the photoactive diodes on higher P-N junction branches 4 may be configured to be more reactive to shorter wavelengths than longer wavelengths, while the photoactive diodes on lower P-N junction branches 4 are configured to be more reactive to longer wavelengths than shorter wavelengths. In one example embodiment, a width of a P-N junction branch 4 furthest away from support base 16 may be on the order of a few tens of micrometers, and a width of a P-N junction branch 4 closest to the support base 16 of the semiconductor structure 2 may be on the order of a few hundred micrometers. A distance between P-N junction branches 4 may also be on the order of a few hundred micrometers, for example. The actual dimensions of each P-N junction branch and their respective heights may be selected according to a desired spectral response of the array of the semiconductor structures 2. In some embodiments, every semiconductor structure 2 in a row may be of the same dimensions and in some embodiments, different semiconductor structures 2 in the same row may have different dimensions. In some embodiments, the dimensions of the semiconductor structures 2 may vary from row to row. In some embodiments, there may be multiple P-N junction branches 4 at multiple levels and at different levels on opposite sides of the semiconductor structure 2.

The semiconductor structure 2 may absorb wavelengths in one range of wavelengths and constructively reflect wavelengths in another range of wavelengths. That is, the semiconductor structure 2 may be a filtering structure of the P-N junction branches 4. Also, the rows of semiconductor structures 2 may form a diffraction grating. The distance and thickness of the P-N junction branches 4, as well as the spacing of the rows of semiconductor structures 2 and the height of the semiconductor structures 2, may be configured to cause light waves 17 in a narrow band of wavelengths to constructively reinforce and light waves 17 of other wavelengths to destructively interfere. Further, the height of the semiconductor structures 2 in the rows may be configured to be of irregular heights, resulting in a diffuse and uniform color, independent of viewing angle. Also, the support base 16 that is beneath the semiconductor structures 2 may be configured to absorb wavelengths in a range of wavelengths to which the P-N junction branches 4 are photoactive. This may reduce background reflection and enhance absorption of wavelengths within a desired range.

Thus, some embodiments may include a device 1 that includes at least one semiconductor structure 2. The semiconductor structure 2 includes a base portion 15 and an elongated portion 3 extending from the base portion 15. The elongated portion 3 may include or be composed of a non-conducting material. The semiconductor structure 2 includes a plurality of P-type-N-type (P-N) junction branches 4 positioned at different sections of the elongated portion 2. Each P-N junction branch 4 includes a photoactive diode 22 having a photoactive area. A P-N junction branch 4 also includes a conductor 8. Each P-N junction branch 4 has a width, where the widths of the plurality of P-N junction branches 4 decrease with increasing distance from the base portion 15, and where the semiconductor structure 2 is configured to absorb photons over a range of wavelengths to which each P-N junction branch 4 is photoactive. In some embodiments, more than multiple levels of P-N junction branches 4 may have the same width. Also, in some embodiments, the cross section of the P-N junction branches 4 may be circular, elliptical, rectangular or be of irregular shape. The cross section of one P-N junction 4 may be of a different shape than the cross section of another P-N junction branch 4. Also, in some embodiments, the cross section of the elongated portion 3 may be circular, elliptical, rectangular or be of irregular shape. Further, the shape of the cross section of the elongated portion 3 may vary with distance from the base portion 15.

In some embodiments, the device 1 also includes a plurality of leads 10, each lead 10 configured to electrically connect to the conductor of a P-N junction branch 4. In some embodiments, there is a plurality of read out transistors 12 positioned in the base portion 15, where each read out transistor 12 is electrically connected to a respective P-N junction branch 4 via a respective lead 10 of the plurality of leads 10 and configured to receive electrical power proportional to photons absorbed by the respective P-N junction branch 4. In some embodiments, a plurality of reset transistors 14 are positioned in the base portion 15, where each reset transistor 14 is electrically connectable to an input of a respective one of the plurality of read out transistors 12 via a respective switch. In some embodiments, the reset transistor 14 includes or operates as the switch.

In some embodiments, a P-N junction branch 4 at one section of the elongated portion 3 is doped differently from a P-N junction branch 4 at another section of the elongated portion 3, where a doping of each P-N junction branch 4 is selected to be most reactive or reactive to a range of wavelengths of an incident light wave. In some embodiments, a spacing between P-N junction branches 4 at different sections of the elongated portion 3 varies with a distance of the P-N junction branch 4 from the base portion 15, where the spacing between P-N junction branches 4 is selected to filter light in a range of wavelengths of an incident light wave. In some embodiments, a length of the elongated portion 3 is selected to provide a level of absorption that exceeds a threshold in a range of wavelengths of an incident light wave 17. In some embodiments, the read out transistor is configured at the base portion 15. In some embodiments, at least one lead is electrically connected to a plurality of P-N junction branches 4. In some embodiments, a photoactive depletion region of at least one P-N junction branch 4 is configured on a first side of the P-N junction branch 4 facing the base portion 15.

The frequency (wavelength or color) response of the device 1 may be designed to provide photoactivity, refraction, reflection and absorption over a bandwidth of operation of the device 1. Variables to consider when designing a device 1 to have the desired photoactive frequency response may include one or more of the following: spacing between elongated portions 3 in the same row, spacing between rows of elongated portions 3, length of each elongated portion 3, cross-section of each elongated portion 3, doping of each of the P-N junction branches 4, convex curvature of an upper and/or lower surface of each P-N junction branch 4, number of P-N branches 4, spacing between P-N junction branches 4, constitutive parameters of the materials used to construct the device 1, thickness of the P-N junction branches and thickness of the base portion 15 and support base 16. Moreover, these parameters may be optimized for a certain range of propagation angles.

Figure 5:
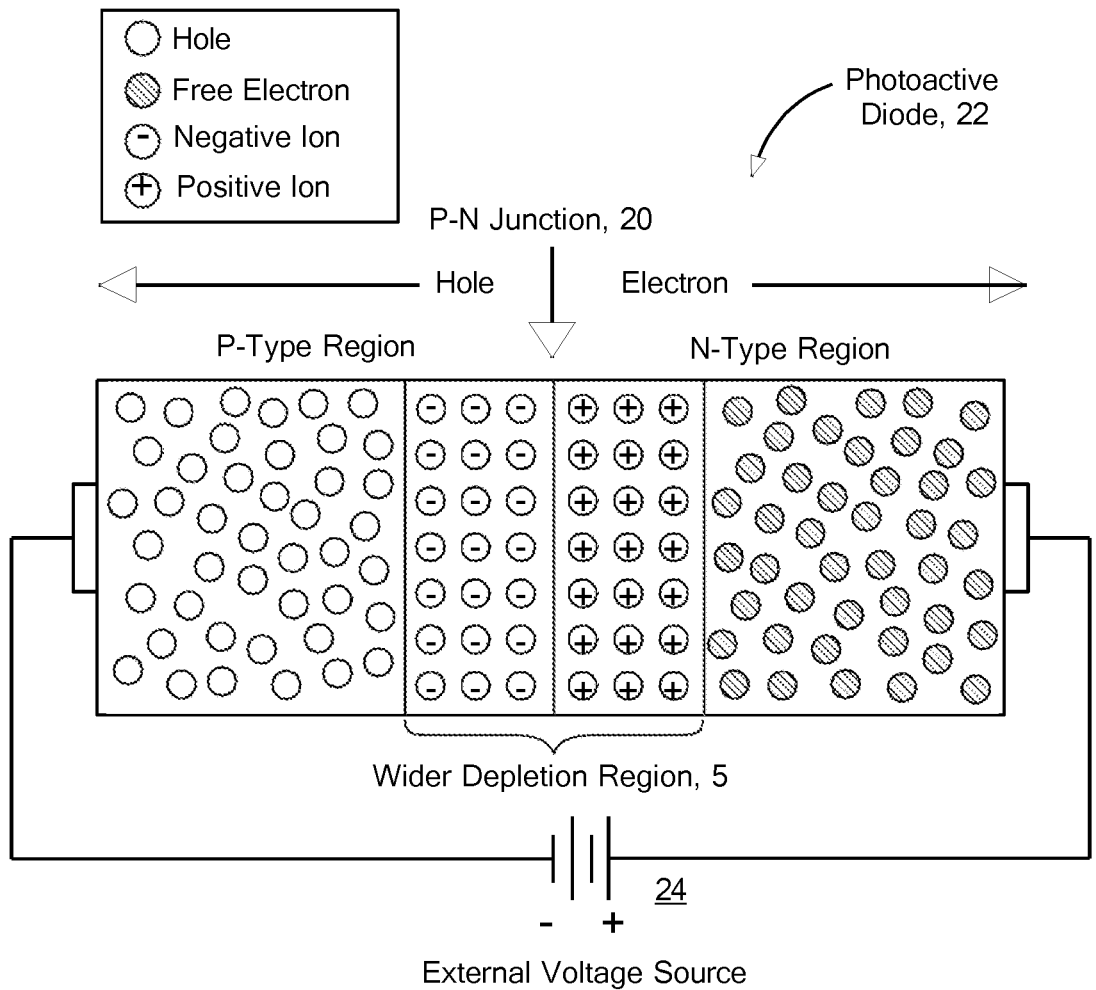
FIG. 5 is a diagram of an example reverse-biased P-N junction diode according to various embodiments of the present disclosure.
Figure 6:
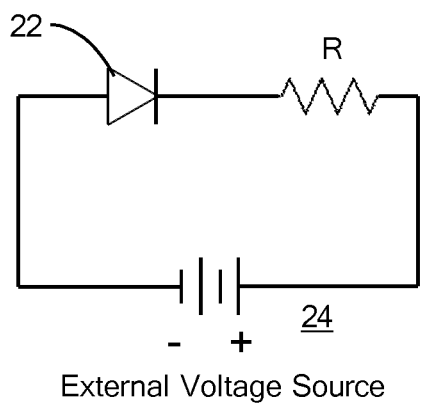
FIG. 6 is a schematic of the reverse biased P-N junction shown in FIG. 4 according to various embodiments of the present disclosure.

FIG. 5 is an example of a P-N junction 20 of a photoactive diode 22 that may be configured on a P-N junction branch 4. The photoactive diode 22 may be connected to an external voltage source 24. FIG. 6 is a circuit diagram of an example photoactive diode 22 connected to the external voltage source 24 through the resistor R. Referring back to FIG. 5, the P-N junction 20 is in a reverse-biased condition with the negative terminal of the external voltage source 24 connected to the P-type region of the P-N junction 20 and with the positive terminal of the external voltage source 24 connected to the N-type region of the P-N junction 20. The P layer of the P-N junction 20 has a plurality of holes (positive), and the N layer of the P-N junction 20 has a plurality of electrons (negative).

Figure 7:
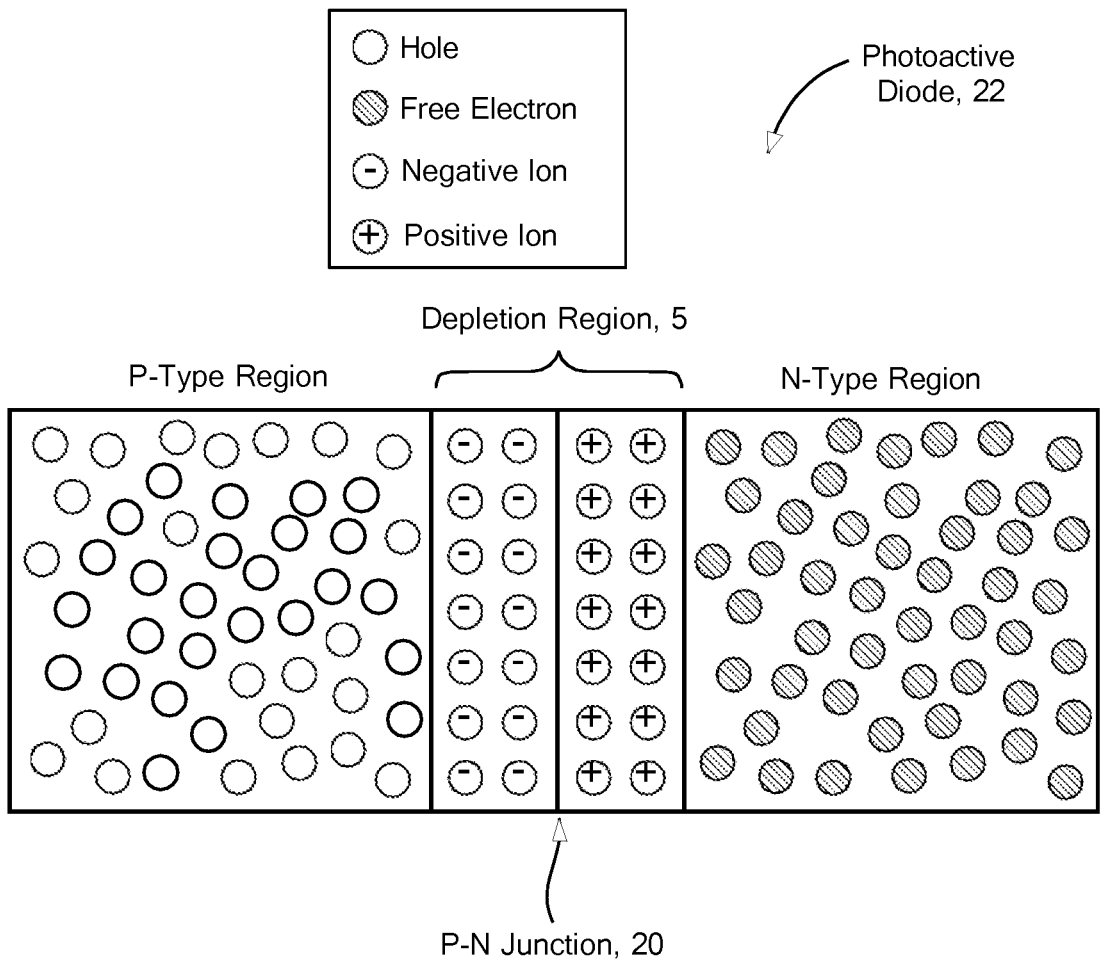
FIG. 7 is a diagram of the P-N junction of FIG. 5 having a narrower depletion region than the depletion region of the P-N junction according to various embodiments of the present disclosure.

Applying a reverse-bias voltage to the P-N junction 20, as shown in FIG. 5, widens the depletion region 5 at the junction of the P-type and N-type material. As the reverse-bias is decreased in magnitude, or as the forward bias is increased, the depletion region 5 narrows, as shown in FIG. 7. However, as the depletion region 5 widens, electrical current flow through the P-N junction 20 decreases, and as the depletion region 5 narrows, electrical current flow through the P-N junction 20 increases. For a photodiode, when light impinges on the P-N junction 20, the depletion region 5 narrows, and the current flow through the photodiode increases. For an LED, when the P-N junction 20 is forward biased, the depletion region 5 narrows, and photons are emitted.

Figure 8:
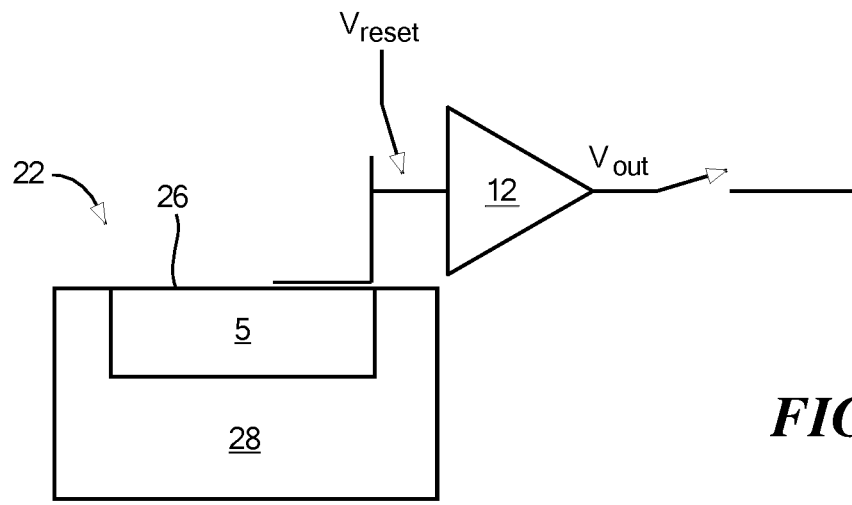
FIG. 8 is a diagram of a P-N junction of FIG. 5 in an initial state with no biasing voltage applied according to various embodiments of the present disclosure.
Figure 9:
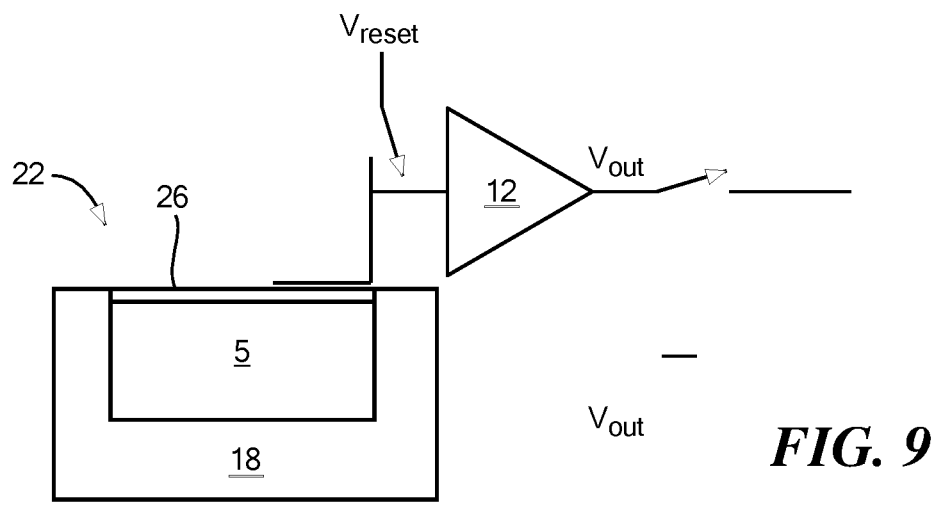
FIG. 9 is a diagram of a P-N junction of FIG. 5 in a state in which a reset voltage is applied according to various embodiments of the present disclosure.
Figure 10:
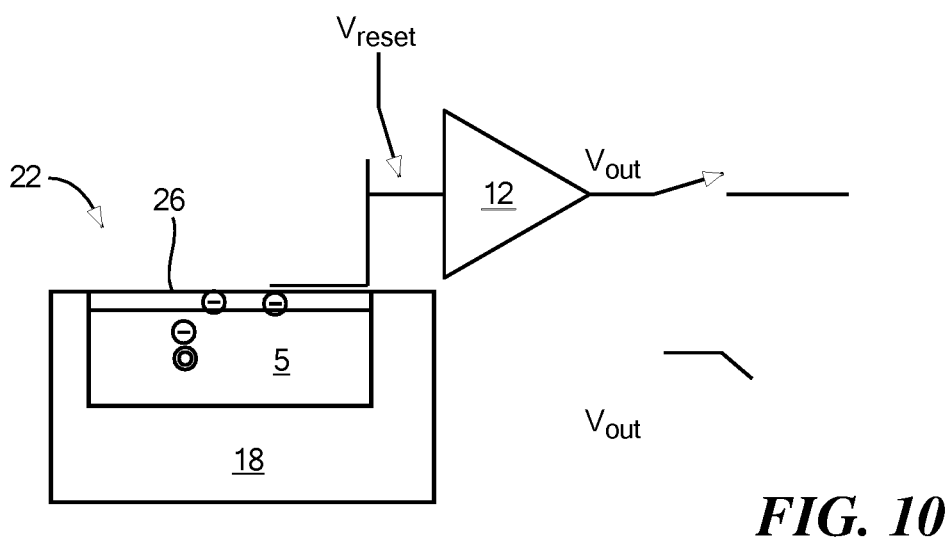
FIG. 10 is a diagram of a P-N junction of FIG. 5 in a state in which the reset voltage has been removed according to various embodiments of the present disclosure.
Figure 11:
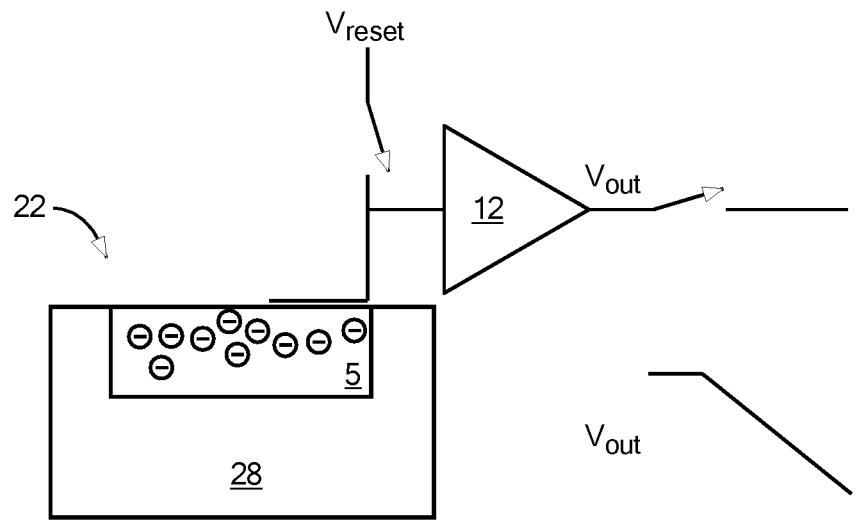
FIG. 11 is a diagram of a P-N junction of FIG. 5 in a state in which light waves are being received according to various embodiments of the present disclosure.
Figure 12:
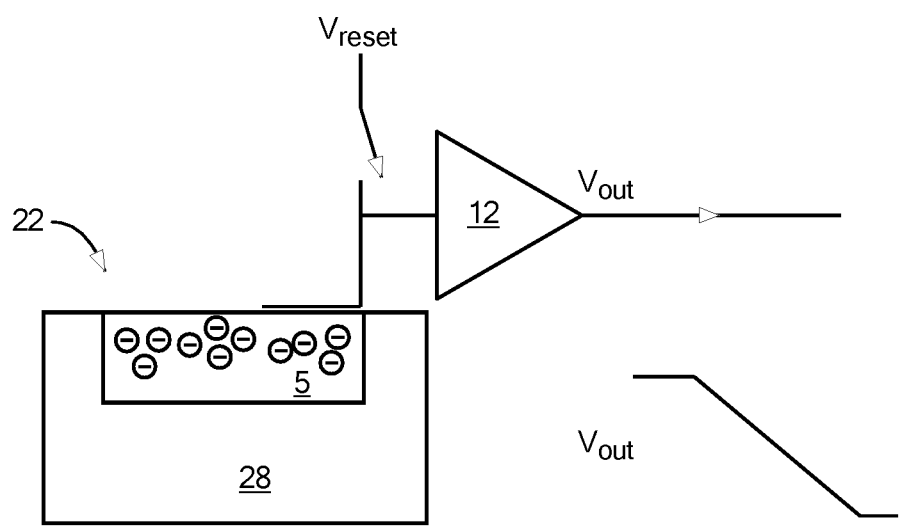
FIG. 12 is a diagram of a P-N junction of FIG. 5 in which the output is connected to external circuitry according to various embodiments of the present disclosure.

FIGS. 8-12 illustrate examples of a semiconductor with a photoactive diode 22 caused to be in a succession of different states according to a sequence of applying and removing a reset voltage to an upper layer 26 of the photoactive diode 22. The photoactive diode 22 includes lower layer 28. When the upper layer 26 is an N-type material, the lower layer 28 is a P-type material, and vice versa. When the reset voltage is applied to the upper layer 26 of the photoactive diode 22, it is also applied to an input of a read out transistor 12. In FIG. 8, no reset voltage is applied to the upper layer 26 and the output voltage of the read out transistor 12 is unconnected to the circuit that processes the signal output by the read out transistor 12. In FIG. 9, the reset voltage is applied to the upper layer 26, but the output voltage of the read out transistor 12 remains unconnected. The output voltage $V_{out}$ is shown to be constant. In FIG. 9, the applied reset voltage reverse biases the P-N junction 20, the depletion region 5 widens. In FIG. 10, the reset voltage is removed from the upper layer 26, while the output voltage of the read out transistor 12 remains unconnected. The depletion region 5 narrows and there is some drop of the output voltage $V_{out}$. In FIG. 11, when light impinges on the P-N junction 20, the depletion region 5 decreases significantly and the output voltage falls further. In FIG. 12, the reset voltage remains unapplied and the output voltage of the read out transistor 12 is connected to an external circuit and remains level.

Figure 13:
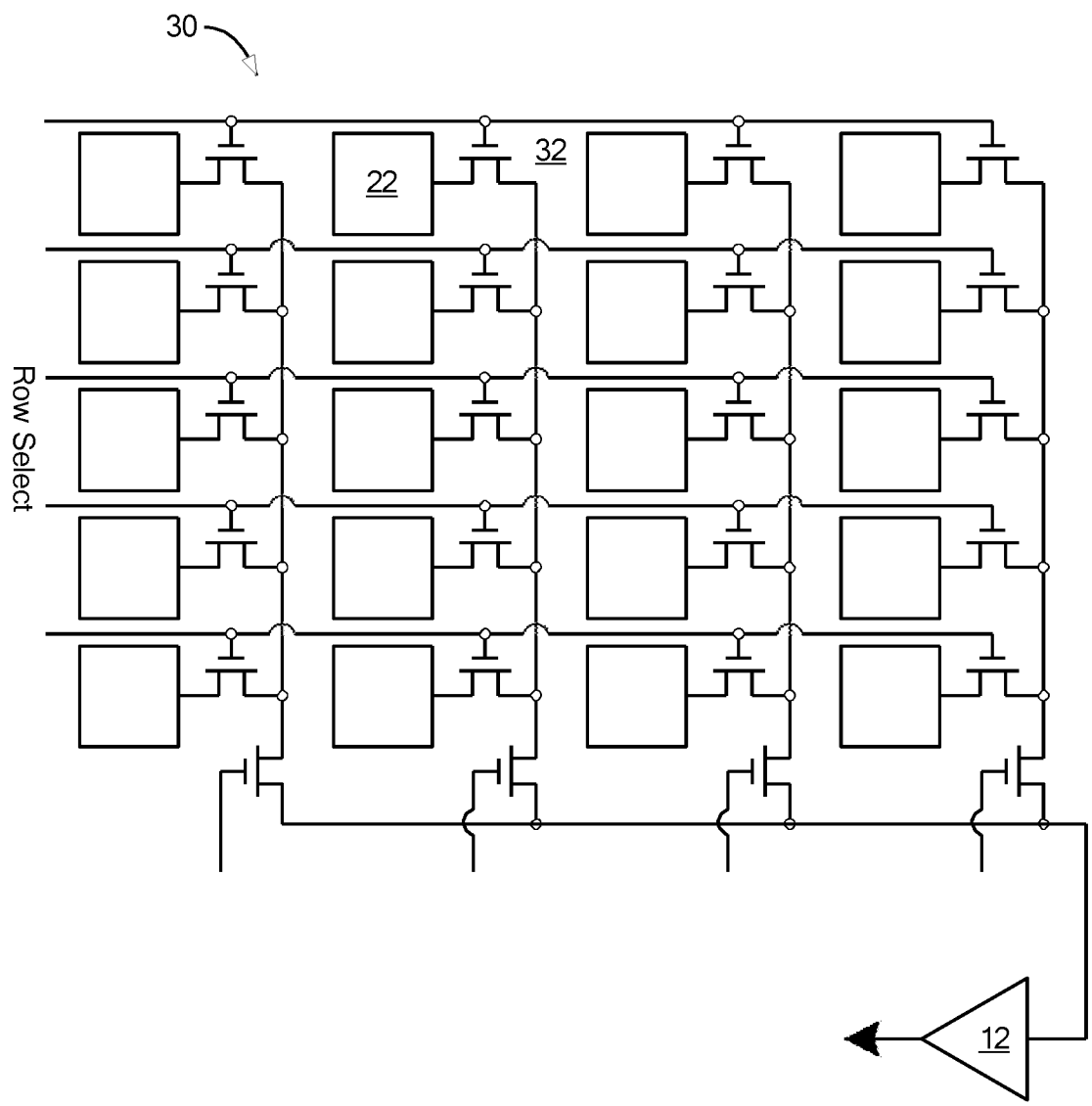
FIG. 13 is a diagram of a CMOS shift register which may be employed in a camera or light emitting diode configuration and that has selectable rows and columns according to various embodiments of the present disclosure.

FIG. 13 is a diagram of a semiconductor device 30 of device 1 according to various embodiments of the present disclosure. Semiconductor device 30 includes an array of photoactive diodes 22 formed by, for example, an array of semiconductor structures 2. Each photoactive diode 22 is connected to a switch 32 such as a reset transistor 14 that is selectably turned on and off using row and column selecting signals. The outputs of the photoactive diodes 22 may be amplified by the read out transistor 12. The row and column selection may be made by CMOS shift registers for camera or LED applications and/or by CMOS or CCD shift registers for solar applications because for solar applications, the P-N junctions may be reset all at once with a single lead 10. In the case of an LED, one P-N junction (for example, a P-N junction on a P-N junction branch 4 at the level closest to the support base 16) may be configured to be saturated so that some photons would be unable to be absorbed into the structure at the P-N junction branch. Also, material that is selectively reflective at the LED wavelength may be combined with the semiconductor structure 2. A translucent material may be employed between rows of semiconductor structures 2.

Some embodiments described herein provide improved spectral sensitivity, reduced heat losses, eliminate costly colored lenses and reduce pixel size and distance between pixels.

Many different embodiments have been disclosed herein, in connection with the above description and the drawings. It would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

In addition, unless mention was made above to the contrary, the accompanying drawings are not to scale. A variety of modifications and variations are possible in light of the above teachings without departing from the scope and spirit of the present disclosure.

What is claimed is:

1. A device, comprising:
a semiconductor structure comprising:
a base portion and an elongated portion extending from the base portion, the elongated portion comprising a non-conducting material;
a plurality of P-type-N-type (P-N) junction branches positioned at different sections of the elongated portion, each P-N junction branch comprising:
a photoactive diode having a photoactive area; and
a conductor;
each P-N junction branch having a width, the widths of the plurality of P-N junction branches decreasing with increasing distance from the base portion, the semiconductor structure being configured to absorb photons over a range of wavelengths to which each P-N junction branch is photoactive;
a plurality of leads, each lead configured to electrically connect to the conductor of the P-N junction branch;
a plurality of read out transistors positioned in the base portion, each read out transistor being electrically connected to a respective P-N junction branch via a respective lead of the plurality of leads and configured to receive electrical power proportional to photons absorbed by the respective P-N junction branch; and
a plurality of reset transistors positioned in the base portion, each reset transistor being electrically connectable to an input of a respective one of the plurality of read out transistors via a respective switch.

2. A device, comprising:
at least one semiconductor structure, comprising:
a base portion and an elongated portion extending from the base portion, the elongated portion including a non-conducting material;
a plurality of P-type-N-type (P-N) junction branches positioned at different sections of the elongated portion, each P-N junction branch comprising:
a photoactive diode having a photoactive area; and
a conductor;
each P-N junction branch having a width, the widths of the plurality of P-N junction branches decreasing with increasing distance from the base portion, the semiconductor structure being configured to absorb photons over a range of wavelengths to which each P-N junction branch is photoactive.

3. The device of claim 2, wherein the elongated portion is wider at a base of the elongated portion than at an apex of the elongated portion.

4. The device of claim 2, wherein a P-N junction branch at one section of the elongated portion is doped differently from a P-N junction branch at another section of the elongated portion, a doping of each P-N junction branch being selected to be reactive to a range of wavelengths of an incident light wave.

5. The device of claim 2, wherein a spacing between P-N junction branches at different sections of the elongated portion varies with distance of the P-N junction branch from the base portion, the spacing between P-N junction branches being selected to filter light in a range of wavelengths of an incident light wave.

6. The device of claim 2, wherein a length of the elongated portion is selected to provide a level of absorption that exceeds a threshold in a range of wavelengths of an incident light wave.

7. The device of claim 2, further comprising a plurality of read out transistors, each of the plurality of read out transistors being electrically connected to a P-N junction branch.

8. The device of claim 7, wherein the plurality of read out transistors are positioned at the base portion.

9. The device of claim 2, further comprising a plurality of reset transistors, each of the plurality of reset transistors being configured to be connectable to an input of a read out transistor via a switch.

10. The device of claim 9, wherein the plurality of reset transistors are positioned at the base portion.

11. The device of claim 2, further comprising a plurality of leads, each lead being electrically connected to the conductor of the P-N junction branch.

12. The device of claim 2, wherein at least one lead is electrically connected to the plurality of P-N junction branches.

13. The device of claim 2, wherein a photoactive depletion region of at least one P-N junction branch is configured on a first side of the P-N junction branch facing the base portion.

14. The device of claim 2, wherein the at least one semiconductor structure comprises a plurality of semiconductor structures arranged in an array.

15. The device of claim 14, wherein the array of semiconductor structures comprises rows of semiconductor structures.

16. The device of claim 15, further comprising a reflector positioned between two rows of semiconductor structures.

17. The device of claim 16, wherein a reflector is wider at a base of the reflector than at an apex of the reflector.

18. The device of claim 14, further comprising, for each semiconductor structure, at least one lead electrically connected to at least one P-N junction branch of the plurality of P-N junction branches of the semiconductor structure.

19. The device of claim 17, further comprising, for each lead, a reset transistor and a switch to selectively connect a reset transistor to a P-N junction branch.

20. The device of claim 18, wherein a spacing between rows of semiconductor structures of the array is selected to filter light waves within a range of wavelengths of a light wave.

\* \* \* \* \*